(12) United States Patent
Bernstein

(10) Patent No.: US 6,426,623 B1
(45) Date of Patent: Jul. 30, 2002

(54) MRI RF POWER MONITOR

(75) Inventor: Matthew A. Bernstein, Rochester, MN (US)

(73) Assignee: Mayo Foundation for Medical Education and Research, Rochester, MN (US)

(*) Notice: Subject to any disclaimer, the term of this patent is extended or adjusted under 35 U.S.C. 154(b) by 0 days.

(21) Appl. No.: 09/964,155

(22) Filed: Sep. 26, 2001

Related U.S. Application Data

(60) Provisional application No. 60/235,813, filed on Sep. 27, 2000.
(51) Int. Cl.[7] .................................................. G01V 3/00
(52) U.S. Cl. ........................................ 324/314; 324/312
(58) Field of Search ................................ 324/314, 312, 324/300, 306, 307, 309, 318, 322

(56) References Cited

U.S. PATENT DOCUMENTS

| | | | |
|---|---|---|---|
| 4,760,336 A | | 7/1988 | Conolly |
| 5,457,385 A | * | 10/1995 | Sydney et al. ............... 324/300 |
| 5,572,126 A | | 11/1996 | Shinnar |
| 6,111,411 A | * | 8/2000 | Saranathan et al. ......... 324/307 |

* cited by examiner

*Primary Examiner*—Louis Arana
(74) *Attorney, Agent, or Firm*—Quarles & Brady, LLP

(57) ABSTRACT

An MRI system performs a pulse sequence to acquire image data from a subject. The RF power applied to the subject is monitored and the acquisition is altered if any one of three trip levels is exceeded. Each trip level is different and is associated with a different time interval over which applied RF power is measured.

8 Claims, 3 Drawing Sheets

MRI RF POWER MONITOR

CROSS REFERENCE TO RELATED APPLICATIONS

This application is based on U.S. Provisional Application Ser. No. 60/235,813, filed on Sep. 27, 2000 and entitled "MRI RF Power Monitor".

BACKGROUND OF THE INVENTION

The field of the invention is nuclear magnetic resonance imaging (MRI) methods and systems. More particularly, the invention relates to the measurement and limitation of RF power produced by an MRI system during a patient scan.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a radio frequency (RF) magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which an RF excitation pulse is applied and these gradients are varied according to a particular localization method. The resulting set of received NMR signals are digitized and processed to reconstruct the image using one of many well known reconstruction techniques. Such pulse sequences may also employ RF refocusing pulses, RF saturation pulses and other types of RF pulses required by the prescribed scan.

Very high field MR systems (such as MR scanners operating at a main field strength of 3.0 Tesla (T)) are becoming more widely available. An enabling technology is the compact, actively shielded magnets, which recently became available. This technology permits the 3.0 T MRI system to be sited in a clinical setting. Clinical applications including pulse sequences, and parameter selections (i.e. protocols) are being developed especially for these high field scanners.

A major limitation of scanning at very high field is the radiofrequency (RF) power deposited in the patient, as measured by the specific absorption rate (SAR). SAR increases approximately quadratically in the range of 1.5 T to 3.0 T. Therefore, applications which are straightforward to implement at standard fields strengths such as 1.5 T can be severely limited by SAR at higher field strengths such as 3.0 T. Specific guidelines for the maximal amount of SAR that may be deposited in the patient are specified by the Food and Drug Administration (FDA) in the United States, and by other regulatory agencies in other countries. If SAR limits are exceeded, undesirable and possible dangerous patient heating may result.

To ensure that SAR deposition is within acceptable limits, prior MR systems employ a number of measures. In one method, the RF power deposited by a particular pulse sequence is estimated with a calculation based on the shape, amplitude, and duration of each of the RF pulses within the pulse sequence. If the estimated SAR for a given pulse sequence exceeds regulatory limits, then the software automatically limits input parameters such as the maximal number of slices, flip angle, or minimal repetition time (TR).

Another method used in commercial MR systems employs power monitor hardware and software. The power monitor measures power transmitted by the RF coil in the MR system. In one commercial system, the average RF power delivered by the RF coil is measured at regular time intervals, approximately every 30 milliseconds (ms). A moving average of approximately 33 consecutive power measurements is calculated. Thus, the averaging time for this system is 30 ms×33 measurements, which is approximately 1 second. If at any time this moving average of measured power exceeds a predetermined limit (e.g. 10 Watts for head coil studies), the power monitor "trips", and the scan is aborted.

A major limitation of the prior methods is many MR pulse sequences contain periods over which there is relatively intense application of RF pulses, followed by relatively quiescent or "dead" periods. In this case, the 1-second average time can be overly restrictive since it can cause power monitor trips that are not necessary to protect the patient from detrimental heating. For example, if the power monitor trip point is set to 10 Watts, and during a 1-second period of intense RF pulse activity the average RF power is 15 Watts, the power monitor would trip. The scan is thus aborted, even if the active period is followed by a 9-second dead time. In the 1-second active period, 15 Joules of energy is deposited into the patient, (assuming 100% coil coupling efficiency). This 15 Joules is an insufficient amount of energy to cause detrimental patient heating. Over the 1+9=10 second interval, the average power is only 15 J/10 s=1.5 Watts, which is well within safe limits. Thus, the scan is unnecessarily aborted.

Simply increasing the averaging period to a value above 1-second is not a safe solution to this problem. For example, if the averaging time is increased to 333 samples, or approximately 10 seconds and 100 Watts is delivered continuously to the patient, then up to 1000 Joules of energy may be deposited before the scan is aborted. This amount of energy could cause harm to the patient.

SUMMARY OF THE INVENTION

The present invention is a method and apparatus for monitoring the RF power applied to a patient during a scan, and altering the scan when excessive RF power is detected. The RF power produced during a scan is measured and a plurality of moving averages of this measured power over a corresponding plurality of different accumulation time intervals are calculated. Associated with each accumulation time interval is a different RF power trip level. If any moving average exceeds the RF power trip level for its accumulation time interval the scan is aborted or altered.

A general object of the invention is to protect, the patient from harmful heating, and avoid unnecessary power monitor trips. If it is determined that 50 Joules of energy is the maximum safe limit to be deposited within the patient in a 1 second period, then the first accumulation time is 1 second, and the RF power trip level is 50 Watts. If it is further determined that within a 5 second period it is safe to deposit 75 Joules, then the trip level for the 5 second accumulation time interval is set to 15 Watts. The longest accumulation time interval is set to 10–30 seconds, which is on the order of the longest repetition time encountered in MR pulse sequences. The trip level for the longest time interval is set to the lowest trip level, for example, 10 Watts. The trip level for this longest accumulation time interval corresponds with the regulator limits set by the FDA.

DESCRIPTION OF THE PREFERRED EMBODIMENT

Figure 1:
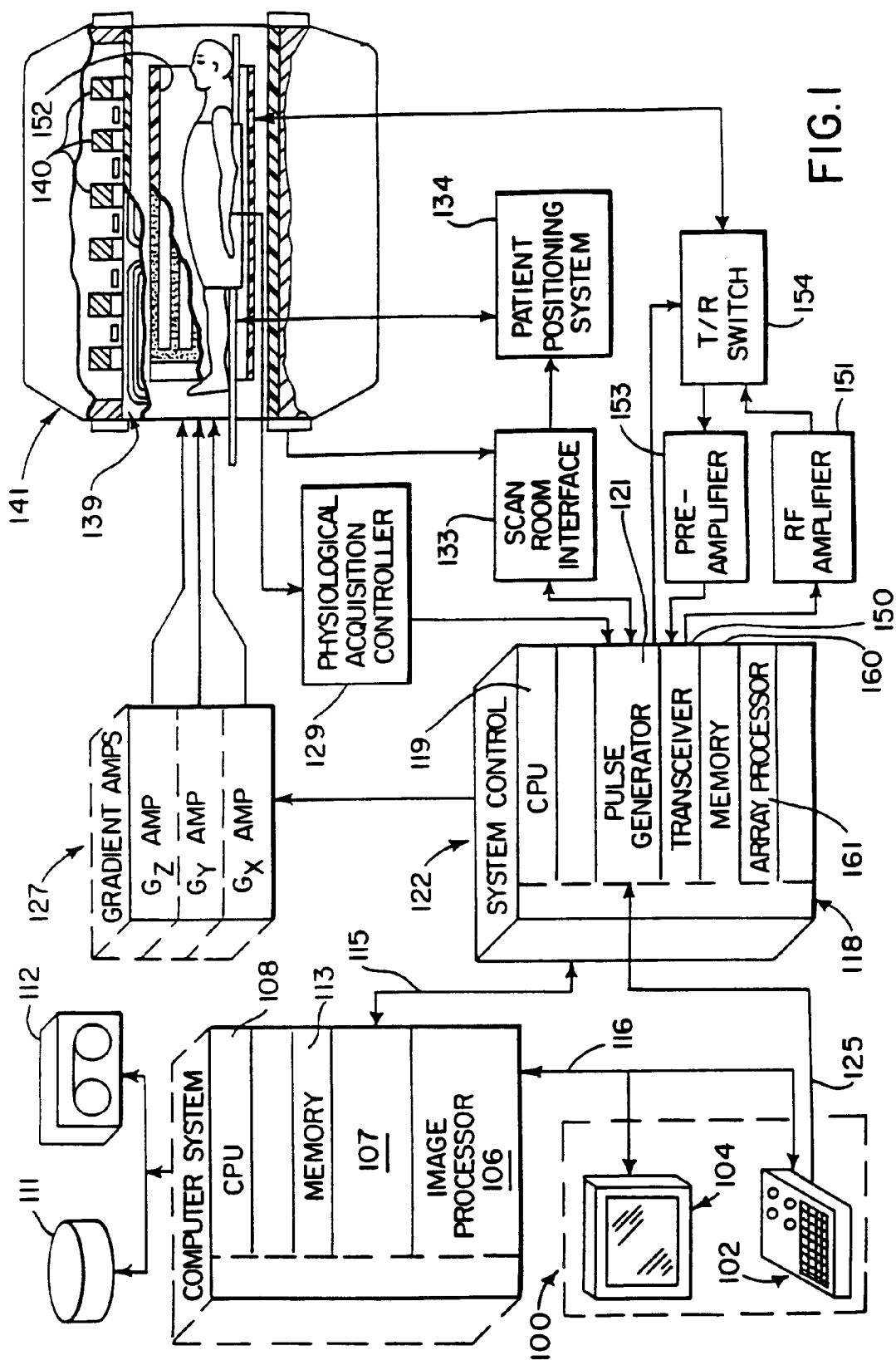
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$, amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
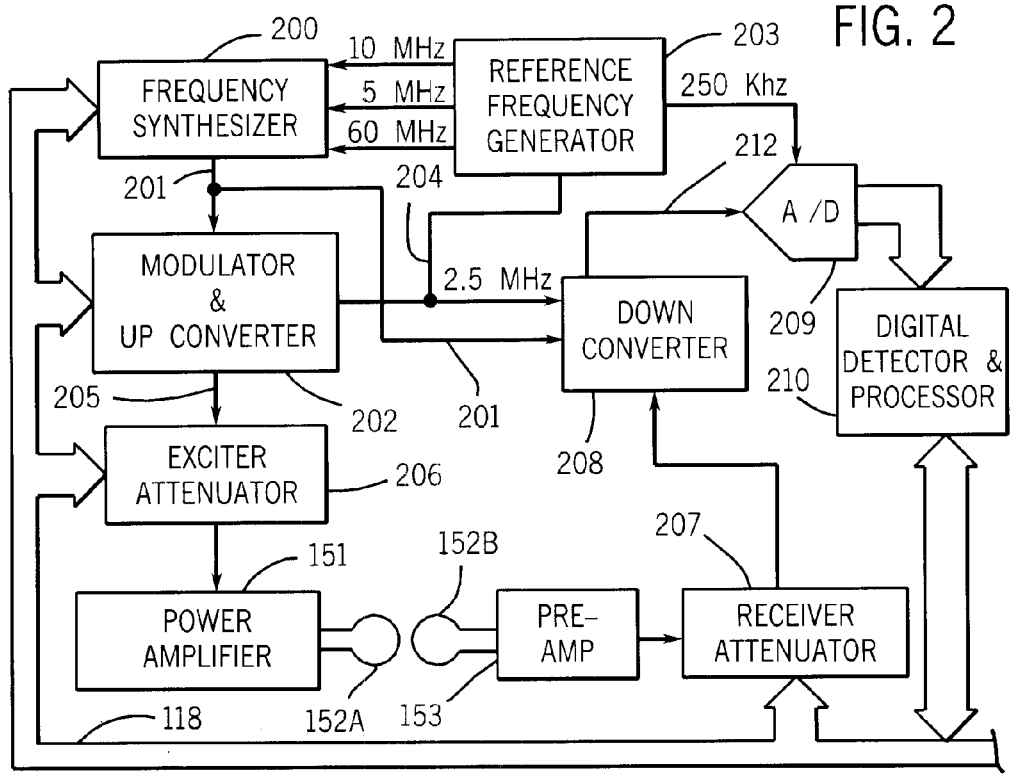
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

The signals employed to control the generation of the attenuated RF excitation pulses are also input to the CPU 119 (FIG. 1) which is programmed to implement the present invention.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 205 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Referring again to FIG. 1, the CPU 119 is programmed to monitor the RF excitation pulses produced by the transceiver 150 and stop the pulse generator 121 from continuing the scan if any of the trip levels are exceeded. A running accumulation of the RF excitation applied to the patient over each of the most recent accumulation time intervals is calculated. Each running accumulation is compared to the trip level for its accumulation time interval, and if any trip level is exceeded, the pulse generator 121 is signaled to stop the scan.

Figure 4:
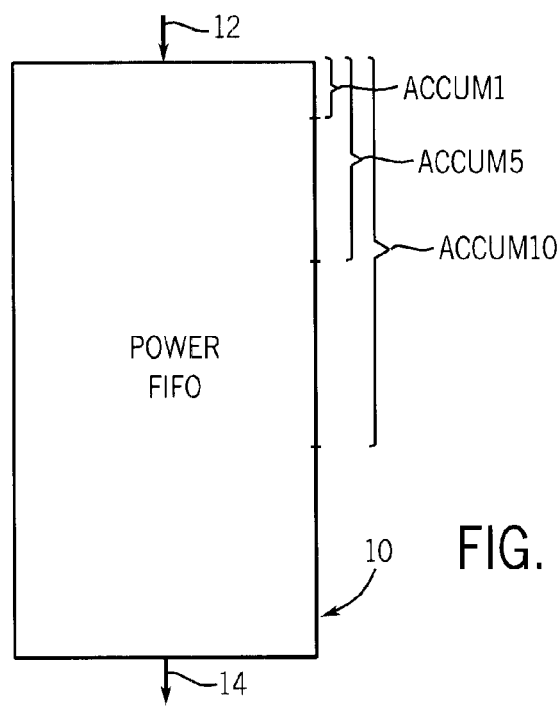
FIG. 4 is a schematic representation of a power FIFO data structure employed by the method of FIG. 3.

As shown in FIG. 4, the measured increment of RF power generated during each successive increment of time is stored in a power FIFO 10. The power FIFO is a memory which receives each increment of RF power at an input 12 and shifts previously stored RF power increments down toward an output 14. The oldest RF power increment is discarded. The power FIFO 10 stores over ten minutes of RF power increments.

Figure 3:
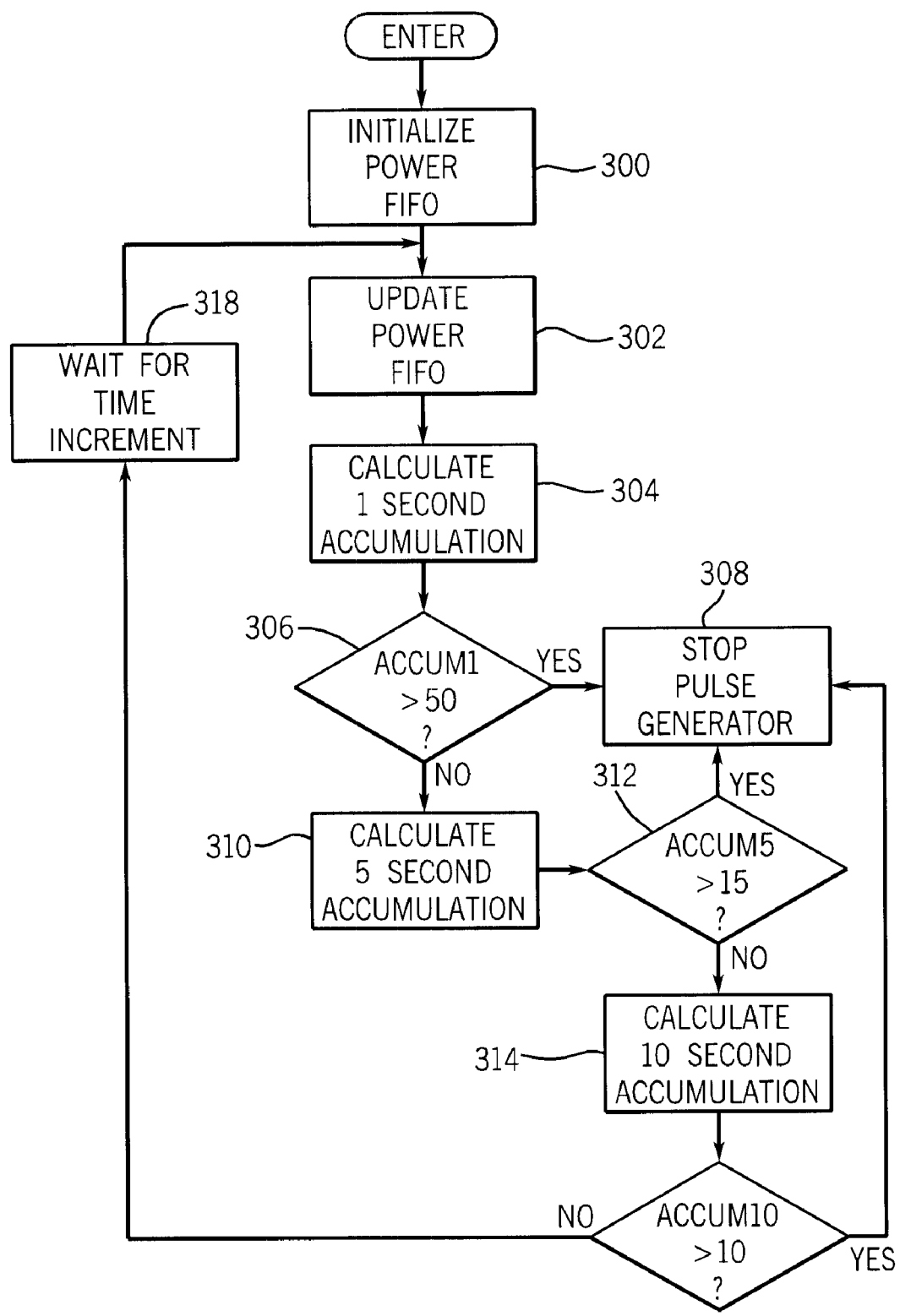
FIG. 3 is a flow chart of a preferred embodiment of the method practiced by the MRI system of FIG. 1.

Referring particularly to FIG. 3, when a scan is performed and the pulse generator 121 begins to direct the generation of the prescribed pulse sequence, a power monitor program is performed by the CPU 119. As indicated by process block 300 the power FIFO 10 is initialized to zero and the first increment of RF power is input at process block 302. The most recent one second of RF power increments stored in the power FIFO 10 are accumulated at process block 304 and the one second power accumulation is compared with a first, 50 watt trip level at decision block 306. If the first trip level is exceeded, the pulse generator 121 is shut down at process block 308.

A second, 5 second, time interval of accumulated RF power increments is calculated at process block 310. The 5 second accumulated power is compared to a second, 15 watt trip level at decision block 312, and if this trip level is exceeded, the pulse generator 121 is shut down. If not, a third, ten second accumulated RF power increment is calculated at process block 314. If this third accumulated power level exceeds a third, 10 watt trip level, as determined at decision block 316, the pulse generator 121 is shut down.

If none of the three trip levels is exceeded, the system waits at process block 318 for the next time increment to elapse. The system then loops back to process block 302 to update the power FIFO with the latest increment of RF power and repeat the process. This monitoring process continues for as long as the pulse generator 121 is producing pulse sequences.

It should be apparent to those skilled in the art that variations are possible from the preferred embodiment described above. Additional accumulated times and additional associated trip levels may be established. Both the time intervals and the trip levels may be changed. In addition, rather than shutting the pulse generator down when the trip level is exceeded, the pulse generator may be switched into another, lower RF power generating mode of operation. This other mode may be, for example, a lengthening of the transmit repeat (TR) interval, or a reduction in the RF pulse flip angle.

What is claim is:

1. A method for monitoring the radio frequency (RF) power produced by a magnetic resonance imaging (MRI) system as it performs a pulse sequence to acquire NMR data from a subject, the steps comprising:

a) measuring the RF power produced by the MRI system over each successive increment of time during the performance of the pulse sequence;

b) storing numbers indicative of the successive increments of measured RF power;

c) accumulating increments of measured RF power over a plurality of different time intervals to produce a corresponding plurality of accumulated power levels;

d) comparing each of the plurality of accumulated power levels with a corresponding one of a plurality of different trip levels; and e) altering the performance of the pulse sequence by the MRI system if any of said accumulated power levels exceeds its corresponding trip level.

2. The method as recited in claim 1 in which the performance of the pulse sequence is stopped in step e).

3. The method as recited in claim 1 in which step c) accumulates increments of measured RF power over three or more different time intervals.

4. The method as recited in claim 1 in which step b) is performed by storing the increments of measured RF power in the order in which they are measured.

5. The method as recited in claim 4 in which step c) is performed by adding together the successive increments of measured RF power over each time interval beginning with the most recently stored increment of measured RF power.

6. A method for limiting the RF power applied to a subject by a magnetic resonance imaging (MRI) system during the acquisition of NMR data, the steps comprising:

a) establishing a plurality of different time intervals;

b) establishing a plurality of trip levels that correspond to the plurality of different time intervals;

c) continuously measuring the RF power applied to the subject over each of the plurality of different time intervals;

d) comparing the measured RF power over each of the plurality of different time intervals with the corresponding trip level; and e) altering the operation of the MRI system to reduce the application of RF power applied to the subject if one said trip levels is exceeded.

7. The method as recited in claim 6 in which the alteration of operation in step e) is to stop the acquisition of NMR data.

8. The method as recited in claim 6 in which said plurality is three or more.

* * * * *